United States Patent
Sou et al.

(10) Patent No.: US 9,299,958 B2
(45) Date of Patent: Mar. 29, 2016

(54) DEVICE FOR DETECTING EVAPORATION SOURCE AND METHOD FOR APPLYING THE SAME

(71) Applicant: EverDisplay Optronics (Shanghai) Limited, Shanghai (CN)

(72) Inventors: ChungChe Sou, Shanghai (CN); WeiMeng Lee, Shanghai (CN)

(73) Assignee: EVERDISPLAY OPTRONICS (SHANGHAI) LIMITED, Shanghai (CN)

( * ) Notice: Subject to any disclaimer, the term of this patent is extended or adjusted under 35 U.S.C. 154(b) by 230 days.

(21) Appl. No.: 14/152,767

(22) Filed: Jan. 10, 2014

(65) Prior Publication Data

US 2014/0238105 A1    Aug. 28, 2014

(30) Foreign Application Priority Data

Feb. 26, 2013   (CN) .......................... 2013 1 0060667

(51) Int. Cl.
*H01L 51/56* (2006.01)
*C23C 14/24* (2006.01)
*C23C 14/54* (2006.01)

(52) U.S. Cl.
CPC ............... *H01L 51/56* (2013.01); *C23C 14/24* (2013.01); *C23C 14/544* (2013.01)

(58) Field of Classification Search
CPC .. C23C 14/543; C23C 14/546; C23C 14/542; C23C 14/547; C23C 16/52; H01L 51/56; H01L 21/67253; H01L 22/12
USPC ........................................................ 73/23.2
See application file for complete search history.

(56) References Cited

U.S. PATENT DOCUMENTS

| | | | | |
|---|---|---|---|---|
| 6,558,735 B2* | 5/2003 | Marcus | ................... | C23C 14/12 118/664 |
| 6,820,485 B2* | 11/2004 | Grimshaw | ............. | G01B 7/066 427/9 |
| 6,830,626 B1* | 12/2004 | Smith | ................... | C23C 14/243 118/724 |
| 7,435,300 B2* | 10/2008 | Ling | ..................... | C23C 14/042 118/712 |
| 7,959,971 B2* | 6/2011 | Ukigaya | ............... | C23C 14/042 427/248.1 |
| 8,252,378 B2* | 8/2012 | Ibe | ........................ | C23C 14/042 427/255.14 |
| 8,628,620 B2* | 1/2014 | Kawato | ............... | H01L 51/0008 118/50 |
| 9,064,740 B2* | 6/2015 | Krijne | ................... | C23C 14/545 |
| 2003/0232563 A1* | 12/2003 | Kamiyama | ........... | C23C 14/568 445/24 |
| 2004/0206182 A1* | 10/2004 | Grimshaw | ............. | G01B 7/066 73/649 |
| 2006/0141169 A1* | 6/2006 | Noguchi | ............. | C23C 14/0694 427/585 |

(Continued)

*Primary Examiner* — Freddie Kirkland, III
(74) *Attorney, Agent, or Firm* — Andrew F. Young, Esq.; Lackenbach Siegel, LLP

(57) ABSTRACT

The present disclosure relates to a process for manufacturing Organic Light-Emitting Diode (OLED) display panel, and in particular to a device and a method for detecting evaporation source. Through installing a mobile detector above a linear evaporation source, the vapor-deposition rate of the whole linear can be timely and effectively detected. The feedback of uniformity of vapor-deposition can be effectively given, and at the same time the abnormity of the vapor-deposition can be found. Meanwhile, in order to increase the yield and quality of product as well as prevent the evaporation source pollution caused by the dropping of some defects such as organic material or dust, the mobile detector is locked in one side of the evaporation source when it does not work.

11 Claims, 2 Drawing Sheets

(56) References Cited

U.S. PATENT DOCUMENTS

| | | | | |
|---|---|---|---|---|
| 2006/0185588 A1* | 8/2006 | Nozawa | ................... | C23C 14/12 118/712 |
| 2007/0243313 A1* | 10/2007 | Hasegawa | ........... | C23C 14/0694 427/8 |
| 2011/0079178 A1* | 4/2011 | Schramm | .............. | C23C 14/546 118/712 |
| 2012/0114840 A1* | 5/2012 | Fukuda | ................... | C23C 14/24 427/9 |
| 2013/0199445 A1* | 8/2013 | Sonoda | ............... | H01L 51/0011 118/712 |
| 2013/0319331 A1* | 12/2013 | Sonoda | ................. | C23C 14/243 118/720 |

* cited by examiner

DEVICE FOR DETECTING EVAPORATION SOURCE AND METHOD FOR APPLYING THE SAME

CROSS-REFERENCE TO RELATED APPLICATIONS

The present application claims priority to and the benefit of Chinese Patent Application No. CN201310060667.6, filed on Feb. 26, 2013, the entire content of which is incorporated herein by reference.

BACKGROUND OF THE INVENTION

1. Field of the Invention

The present disclosure relates to a manufacturing process for OLED display panel, more specifically, to a device for detecting evaporation source and a method for applying the same.

2. Description of the Related Art

Organic Light-Emitting Diode ("OLED", hereinafter) usually consists of the organic material coating and glass substrate. The organic material will luminesce when a current passes through.

Due to the large visible angle and the observably electricity saving ability, OLED display panel has been widely used in field of flat-screen. The vapor-deposition process of OLED is the core technology for large-scale manufacturing OLED. The process is mainly carried out by small molecule OLED process. In this process, the small molecule material is evaporated by heating linear evaporation source in high vacuum condition, i.e., a vapor-deposition of small molecule covers the substrate at its frontage by metal mask, and the organic material is deposited onto the substrate thereafter.

Vapor-deposition rate control of linear evaporation source and uniformity control thereof are core technology of vapor-deposition of OLED process. In related art, conventional vapor-deposition, the vapor-deposition rate and the vapor-deposition uniformity of the evaporation source is mainly detected by CRTS (crystal sensor) quartz crystal resonator fixed above the evaporation source. However, CRTS quartz crystal resonator is installed immovably, and consequently, the CRTS quartz crystal resonator can just detect the regional vapor-deposition rate and vapor-deposition uniformity of the evaporator source, rather than detect the entire vapor-deposition rate and vapor-deposition uniformity of the evaporator source. Therefore, the abnormity of the uniformity of the whole evaporation source, such as blocked hole of evaporation source, can not be detected in time, which inevitably results in security risks in the producing process and a reduction of yield of product.

FIG. 1 is a schematic drawing of structure showing a fixed installation of the CRTS detector for evaporation source detecting. FIG. 1 shows that when vapor-deposition is carried out on Substrate 13, the fixed CRTS detector is installed above Linear Evaporation Source 11. Due to the fixed position of CRTS Detector 12, the vapor-deposition rate and vapor-deposition uniformity of the Linear Evaporation Source 11 can only be reached at the end close to CRTS Detector 12, However, the vapor-deposition rate and vapor-deposition uniformity of the Linear Evaporation Source 11 are fail to be detected at the further end of CRTS. Particularly, when an abnormity affects the uniformity of the linear evaporation source, such as blocked hole, occurs in the CRTS at the further end of the Linear Evaporation Source 11, the related art fails to detect it. Therefore, the yield of product reduces and the process cost easily increases.

Chinese Patent No. CN102102175A discloses a linear evaporation source, as well as a deposition equipment comprising therein. In order to form disposition materials, usually, to further minimize the error of mass of the disposition materials and uniformly form a plating layer, separators are installed in a fusion pot of linear evaporation source. However, it dose not disclose the solutions to detecting the vapor-deposition rate and vapor-deposition uniformity of linear evaporation source.

Chinese Patent CN102703866A discloses a precise-controlling evaporating equipment. A crystal resonation sensor is provided closing to the substrate in vacuum chamber. More specifically, the sensor is installed above a glass substrate, where the deposition rate of evaporated materials is detected thereby, more precisely, and thus creating a condition for precisely controlling the evaporation rate. In related art, the crystal resonation sensor is installed above the glass substrate, which is applied in this patent for detecting the vapor-deposition rate and vapor-deposition uniformity of linear evaporation source. However, the installation of the crystal resonation sensor above the linear evaporation source will lead to dropping down of some defects affected by the mechanical operation, such as organic material or dust, and will further result the pollution of the evaporation source and the increasing process cost.

SUMMARY OF THE INVENTION

An aspect of an embodiment of the present disclosure is directed toward a device for detecting evaporation source, which is capable of detecting the abnormity of the vapor-deposition and increasing the yield and quality of product.

Another aspect of an embodiment of the present invention is directed toward a method for the application of the device.

An embodiment of the present disclosure provides a device for detecting evaporation source, comprising: a guide rail device installed on the vapor-deposition equipment, the vapor-deposition equipment having a linear evaporation source; and a detector movably installed at a preconfigured distance from the linear evaporation source via the guide rail device, for entirely detecting vapor-deposition rate of the evaporation source; wherein, the detector moves along longitudinal direction of the linear evaporation source by the guide rail device.

It further comprises a connecting structure, wherein one end of the connecting structure is connected with the detector, and the other end is movably connected with the guide rail device. And it further comprises a power device for driving the connecting structure driving the detector to move along a locus of the guide rail device. The guide rail device comprises a standby guide rail, a detecting guide rail, and a deflector; the detector reciprocates along the longitudinal direction of the linear evaporation source for entirely detecting the linear evaporation source by the detecting guide rail; through the standby guide rail, the detector stops at a side close to the linear evaporation source; the detector is switched between the standby guide rail and the detecting guide rail, meanwhile, during the switch between the standby guide rail and the detecting guide rail, the moving direction of the detector is the vertical direction of the linear evaporation source by the deflector. The movement of the detector along the longitudinal direction of the linear evaporation source via the detecting guide rail is reciprocation.

Another embodiment of the present disclosure provides a method for applying a device for detecting evaporation source, which is applied to a vapor-deposition equipment, comprising: positioning a detector at a side closed to a linear evaporation source; moving the detector to a position above the linear evaporation source by a guide rail device; and movably detecting the linear evaporation source along a locus the same shape as the linear evaporation source by the detector; wherein, the guide rail device is installed on the vapor-deposition equipment; the detector is movably installed at a preconfigured distance from the linear evaporation source via the guide rail device, for entirely detecting vapor-deposition rate of the evaporation source; the detector moves along longitudinal direction of the linear evaporation source by the guide rail device.

The device further comprises a connecting structure, one end of the connecting structure is connected with the detector, and the other end is movably connected with the guide rail device. The device further comprises a power device for driving the connecting structure driving the detector to move along a locus of the guide rail device. The vapor-deposition is carried out in a vacuum chamber. During the movable detection, the detector moves at a uniform motion. The detector is CTRS crystal resonator.

BRIEF DESCRIPTIONS OF THE DRAWINGS

The accompanying drawings, together with the specification, illustrate exemplary embodiments of the present disclosure, and, together with the description, serve to explain the principles of the present disclosure.

DETAILED DESCRIPTIONS

Hereinafter, certain exemplary embodiments according to the present disclosure will be described with reference to the accompanying drawings.

Figure 1:
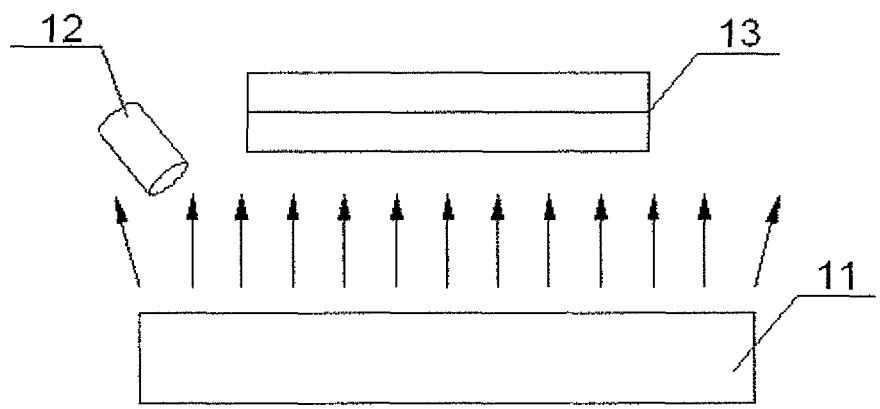
FIG. 1 shows a schematic drawing of structure showing a fixed installation of the CRTS detector for detecting evaporation source.
Figure 2:
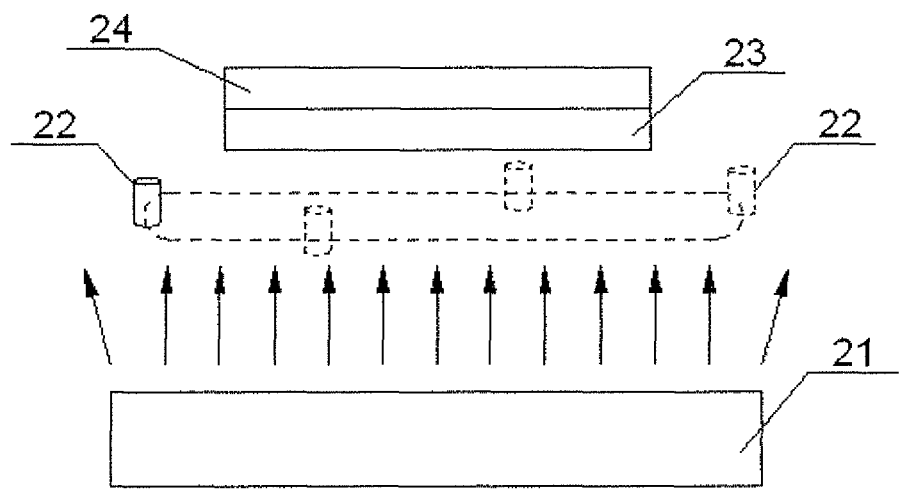
FIG. 2 shows a schematic drawing of a moving locus of detector.
Figure 3:
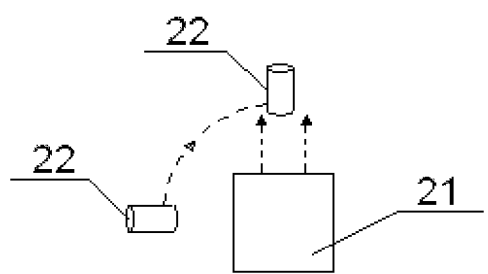
FIG. 3 shows a schematic drawing of the detector moving from the standby location to the detecting location.

As shown in FIGS. 2 and 3, during a vapor-deposition process in a vacuum chamber, a Vapor-Deposited Substrate 24 is placed above Linear Evaporation Source 21 of the vapor-deposition equipment. Plating Layer 23 is deposited onto the lower surface of Vapor-Deposited Substrate 24.

The vapor-deposition rate of the Linear Evaporation Source 21 is crucial for Plating Layer 23. Detector 22, such as CRTS crystal resonator, is provided for entirely detecting the vapor-deposition rate of Linear Evaporation Source 21, where other types of evaporation sources are also available. Detector 22 is movably installed on guide rail device via a connecting structure with which the detector is connected. There is a preconfigured distance between Detector 22 and Linear Evaporation Source 21. The guide rail device is fixed on the vapor-deposition equipment, for example, is fixed on a supporting structure of the vapor-deposition equipment, comprising standby guide rail, detecting guide rail and deflector. A switch can be carried out between the standby guide rail and the detecting guide rail by the deflector. And the connecting structure is driven by a powder device, such as motor, for driving Detector 22 to move along the guide rail device.

Preferably, Detector 22 reciprocates along the longitudinal direction of Linear Evaporation Source 21 for entirely detecting the linear evaporation source.

FIG. 3 also shows that when Detector 22 is out of work for detection, the power device drives connecting structure to switch into the standby guide rail via the deflector, making Detector 22 located at the side close to Linear Evaporation Source 21 at the standby location. Therefore, when Detector 22 is mechanically operated, there is no dropping down of any defects, such as organic material and dust, into Linear Evaporation Source 21, which pollutes the evaporation source. Meanwhile, when Detector 22 runs for detecting, the power device drives the connecting structure to switch into the detecting guide rail via the deflector, making Detector 22 above the Linear Evaporation Source 21 (at detecting location) and making Detector 22 reciprocating for detecting along a locus same as the shape with Linear Evaporation Source 21, such as the shape of the evaporation side. Moreover, during the reciprocation of Detector 22, a movement at an instance speed can be selected, or detection at some preconfigured locations can be selected. Preferably, all the preconfigured locations are above Linear Evaporation Source 21, ensuring that, when detecting by Detector 22, entirely detecting the vapor-deposition rate of Linear Evaporation Source 21 can be achieved, and effectively giving a feedback about uniformity of the vapor-deposition process and duly finding the abnormity of Linear Evaporation Source 21, such as the blocking holes of the evaporation source. Therefore, the yield and quality of the product are increase.

While the present disclosure has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A device for detecting evaporation source, comprising:
a guide rail device installed on a vapor-deposition equipment, the vapor-deposition equipment having a linear evaporation source; and
a detector movably installed at a preconfigured distance from the linear evaporation source via the guide rail device, for entirely detecting vapor-deposition rate of the evaporation source;
wherein, the detector moves along longitudinal direction of the linear evaporation source by the guide rail device;
wherein, the guide rail device comprises a standby guide rail, a detecting guide rail, and a deflector:
the detector reciprocates along the longitudinal direction of the linear evaporation source for entirely detecting the linear evaporation source by the detecting guide rail;
through the standby guide rail, the detector stops at a side close to the linear evaporation source:
the detector is switched between the standby guide rail and the detecting guide rail, meanwhile, during the switch between the standby guide rail and the detecting guide rail, the moving direction of the detector is the vertical direction of the linear evaporation source by the deflector.

2. The device as disclosed in claim 1 further comprising a connecting structure,
wherein one end of the connecting structure is connected with the detector; and the other end is movably connected with the guide rail device.

3. The device as disclosed in claim 2 further comprising a power device for driving the connecting structure driving the detector to move along a locus of the guide rail device.

4. The device as disclosed in claim 1, wherein, the movement of the detector along the longitudinal direction of the linear evaporation source via the detecting guide rail is reciprocation.

5. A method for applying a device for detecting evaporation source, which is applied to a vapor-deposition equipment, comprising:
(a) positioning a detector at a side closed to a linear evaporation source;
(b) moving the detector to a position above the linear evaporation source by a guide rail device; and
(c) movably detecting the linear evaporation source along a locus the same shape as the linear evaporation source by the detector;
wherein, the guide rail device comprises a standby guide rail, a detecting guide rail, and a deflector;
the detector reciprocates along the longitudinal direction of the linear evaporation source for entirely detecting the linear evaporation source by the detecting guide rail;
through the standby guide rail, the detector stops at a side close to the linear evaporation source;
the detector is switched between the standby guide rail and the detecting guide rail, meanwhile, during the switch between the standby guide rail and the detecting guide rail, the moving direction of the detector is the vertical direction of the linear evaporation source by the deflector.

6. The method as disclosed in claim 5, wherein, the guide rail device is installed on the vapor-deposition equipment; the detector is movably installed at a preconfigured distance from the linear evaporation source via the guide rail device, for entirely detecting vapor-deposition rate of the evaporation source; the detector moves along longitudinal direction of the linear evaporation source by the guide rail device.

7. The method as disclosed in claim 6, wherein, the device further comprises a connecting structure, one end of the connecting structure is connected with the detector, and the other end is movably connected with the guide rail device.

8. The method as disclosed in claim 7, wherein, the device further comprises a power device for driving the connecting structure driving the detector to move along a locus of the guide rail device.

9. The method as disclosed in claim 6, wherein, the vapor-deposition is carried out in a vacuum chamber.

10. The method as disclosed in claim 6, wherein the detector moves at a uniform motion.

11. The method as disclosed in claim 6, wherein, the detector is CTRS crystal resonator.

* * * * *